US010491096B2

(12) United States Patent
Ramabhadran et al.

(10) Patent No.: US 10,491,096 B2
(45) Date of Patent: Nov. 26, 2019

(54) SYSTEM AND METHOD FOR RAPID CURRENT SENSING AND TRANSISTOR TIMING CONTROL (71) Applicant: General Electric Company, Schenectady, NY (US)

(72) Inventors: Ramanujam Ramabhadran, Niskayuna, NY (US); Robert James Thomas, Rexford, NY (US); Ahmed Elasser, Latham, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/682,940

(22) Filed: Aug. 22, 2017

(65) Prior Publication Data
US 2019/0068045 A1 Feb. 28, 2019

(51) Int. Cl.
*H02M 1/00* (2006.01)
*H02M 1/08* (2006.01)
(Continued)

(52) U.S. Cl.
CPC ............ *H02M 1/08* (2013.01); *H01F 27/292* (2013.01); *H01F 27/427* (2013.01); *H02M 1/32* (2013.01);
(Continued)

(58) Field of Classification Search
CPC ..................................................... H02M 1/08
See application file for complete search history.

(56) References Cited

U.S. PATENT DOCUMENTS 4,796,145 A  1/1989  Oshikiri
6,414,582 B1  7/2002  Brkovic et al.
(Continued)

FOREIGN PATENT DOCUMENTS

CN  201369232 Y  12/2009
JP  2000166256 A  6/2000

OTHER PUBLICATIONS

Picard, "Under the Hood of Flyback SMPS Designs," 2010 Texas Instruments Power Supply Design Seminar, pp. 1-41.
(Continued)

*Primary Examiner* — Kyle J Moody
*Assistant Examiner* — Trinh Q Dang
(74) *Attorney, Agent, or Firm* — Ziolkowski Patent Solutions Group, SC; Jean K. Testa (57) ABSTRACT A power electronics circuit is disclosed that includes a switching circuit comprising a first solid-state device coupled in series with a second solid-state device, with at least the first solid-state device comprising a solid-state switch having a gate terminal. The power electronics circuit also includes a current sense transformer positioned between the first and second solid-state devices and configured to sense a current flowing on a conductive trace connecting the first and second solid-state devices, and a controller coupled to the switching circuit and the current sense transformer so as to be in operable communication therewith. The controller is programmed to receive a current sense signal from the current sense transformer indicative of the current flowing on the conductive trace and modulate a gate voltage to the gate terminal of the first solid-state device based on the received current sense signal, so as to control switching thereof.

18 Claims, 8 Drawing Sheets

(51) Int. Cl.
    *H02M 1/32*     (2007.01)
    *H02M 1/38*     (2007.01)
    *H02M 1/44*     (2007.01)
    *H05K 1/02*     (2006.01)
    *H05K 1/11*     (2006.01)
    *H05K 1/16*     (2006.01)
    *H05K 1/18*     (2006.01)
    *H01F 27/29*     (2006.01)
    *H01F 27/42*     (2006.01)

(52) U.S. Cl.
    CPC ............... *H02M 1/38* (2013.01); *H02M 1/44* (2013.01); *H05K 1/0216* (2013.01); *H05K 1/111* (2013.01); *H05K 1/165* (2013.01); *H05K 1/181* (2013.01); *H02M 2001/0009* (2013.01); *H02M 2001/0051* (2013.01); *H02M 2001/0054* (2013.01); *H05K 2201/1003* (2013.01); *H05K 2201/1028* (2013.01); *H05K 2201/10053* (2013.01); *H05K 2201/10151* (2013.01); *H05K 2201/10166* (2013.01); *H05K 2201/10174* (2013.01); *H05K 2201/10287* (2013.01); *H05K 2201/10522* (2013.01)

(56) References Cited

U.S. PATENT DOCUMENTS

| | | | |
|---|---|---|---|
| 8,633,512 | B2 | 1/2014 | Havanur |
| 8,749,939 | B2 | 6/2014 | Tran et al. |
| 9,053,845 | B2 | 6/2015 | Catalano et al. |
| 9,276,476 | B1 | 3/2016 | Martinelli |
| 9,473,132 | B2 | 10/2016 | Brinlee |
| 9,500,678 | B2 | 11/2016 | Williams |
| 2002/0089321 | A1 | 7/2002 | Matsuda |
| 2005/0071090 | A1 | 3/2005 | Katou |
| 2011/0090725 | A1 | 4/2011 | Lu |
| 2011/0148376 | A1 | 6/2011 | Xu et al. |
| 2013/0328655 | A1 | 12/2013 | Catalano et al. |
| 2014/0035627 | A1* | 2/2014 | Dunipace ............... H03K 3/012 327/109 |

OTHER PUBLICATIONS

Balogh, "Design and Application Guide for High Speed MOSFET Gate Drive Circuits," ReiBot.org, 2011, pp. 1-37.
PCT International Search Report and Written Opinion, International Application No. PCT/US2018/047432, dated Nov. 16, 2019.

* cited by examiner

SYSTEM AND METHOD FOR RAPID
CURRENT SENSING AND TRANSISTOR
TIMING CONTROL

BACKGROUND OF THE INVENTION

Embodiments of the invention relate generally to electronic converters and, more particularly, to a system for rapid current sensing and optimizing switching timing in a multi-switch power converter.

Figure 1:
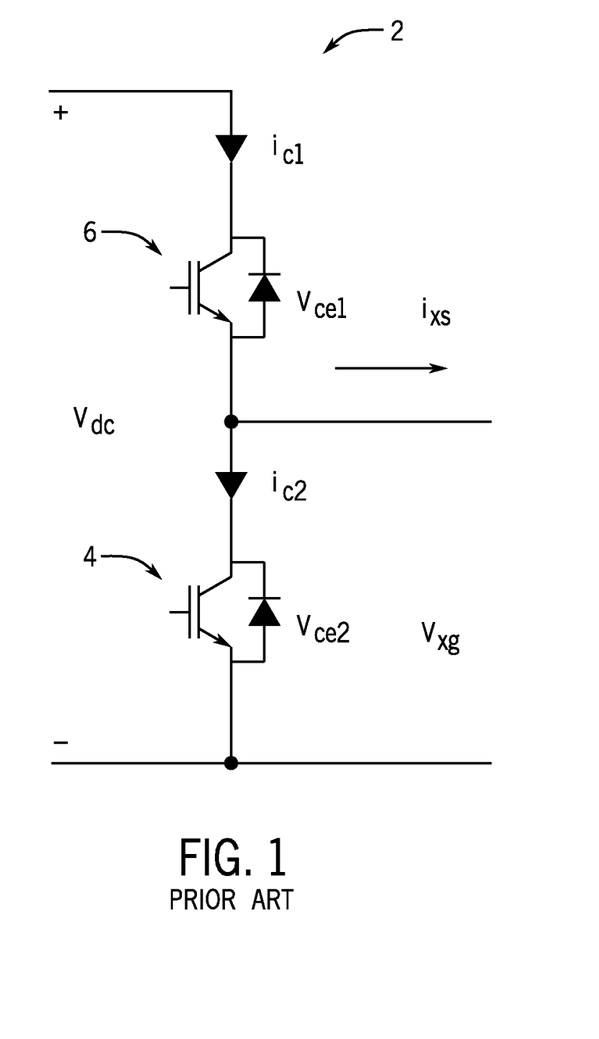
FIG. 1 is a circuit diagram of a known half-bridge circuit topology of a fundamental building block for a power converter.

In power electronics circuits, a half-bridge circuit arrangement is used to control power conversion and current flow through the electronics circuit. FIG. 1 illustrates a known half-bridge circuit topology 2, with the half-bridge circuit 2 including a pair of switches 4, 6 that may be controlled according to a pulse-width modulation (PWM) scheme to convert DC voltage ($V_{dc}$) to an AC waveform on the voltage output ($v_{out}$) to control an AC load such as an AC motor, for example. The half-bridge circuit 2 may be used for one phase of a single- or multi-phase DC-to-DC or DC to AC converter. Typically, switches 4, 6 are operated in an alternating manner in which one switch is in the on-state while the other switch is in the off-state. Controlling which switch is in the on-state via the PWM scheme causes the AC waveform on the voltage output ($v_{out}$) to be generated according to a desired frequency.

It is recognized that the transition of a switch (e.g., switch 4) from its on-state to its off-state (or its off-state to on-state) is not an instantaneous process. That is, it takes some time for switch 4 to stop conducting current therethrough. If the other switch (e.g., switch 6) begins conducting current prior to the shut-off of current through switch 4, a "shoot-through" condition may be created in which the DC voltage ($V_{dc}$) becomes shorted, possibly damaging the voltage source supplying $V_{dc}$. Accordingly, in the traditional implementation of half-bridge circuit 2, a dead-time is calculated and added to the PWM scheme to avoid activating both switches 4, 6 to their on-states simultaneously. Furthermore, in a diode-solid state switch series connection, it is recognized that when a switch, such as switch 4, is turned on, there may be a stored charge in the diode that causes the diode to behave as a short circuit or that there may be a residual capacitance across the diode (and an accompanying capacitor) that is discharged. This discharging of current may cause large current spikes that can cause electromagnetic interference (EMI), excess dissipation, and switching loss in the power electronics circuit.

In order to avoid the occurrence of a shoot-through condition and/or a current surge (and associated EMI and switching losses) caused by switching in a half-bridge circuit or diode-solid state switch series connection, current sensing is typically used to control and modulate the gating of the switch or switches in the electronic circuit. Typically, such current sensing is achieved via the use of current sensing circuits such as Hall sensors, low inductance shunts, current sense transformers, etc. However, it is recognized that such current sensing circuits may be costly, inaccurate, and, in some instances, may impact the layout of the power converter. That is, with wide band gap devices, the speed of sensing and control of timing is a critical issue that many implementations fail to achieve. Transition times in such devices are of the order of a few nanoseconds, and sensing is heavily influenced by parasitic elements, and control needs to be fast. To achieve both speed and effective timing control, both the sensing and control circuitry must have minimal delays, both by design as well as by implementation in layout. With specific reference to current sense transformers, it is recognized that the size thereof is the necessary result of the electromagnetic nature of transformers, requiring such sub-components as wire windings, a ferrite or other magnetic core, and the like, and that these physical limitations inhibit the ability of transformers to be miniaturized at the same rate as the solid-state components of power converters, switching power supplies, and other electronic subsystems. Thus, in some implementations that require very tight layouts, such as in electric vehicles that implement power electronics converters such as on-board chargers, traction inverters (and on board distribution at 48V) having wide band gap devices such as SiC and GaN switches, traditional current sensing circuits (including current sense transformers) may negatively impact the layout of the charger/converter, as well as the circuit inductance thereof.

It would therefore be desirable to provide a system and method for current sensing that provides for accurate control and switching in power electronics circuits to minimize shoot through currents, turn-on losses, and EMI. It would also be desirable for such a system and method to provide such current sensing and control with minimal impact on circuit inductance and circuit layout and at a reasonable cost.

BRIEF DESCRIPTION OF THE INVENTION

According to one aspect of the invention, a power electronics circuit includes a switching circuit comprising a first solid-state device coupled in series with a second solid-state device, with at least the first solid-state device comprising a solid-state switch having a gate terminal. The power electronics circuit also includes a current sense transformer positioned between the first and second solid-state devices and configured to sense a current flowing on a conductive trace connecting the first and second solid-state devices, and a controller coupled to the switching circuit and the current sense transformer so as to be in operable communication therewith. The controller is programmed to receive a current sense signal from the current sense transformer indicative of the current flowing on the conductive trace and modulate a gate voltage to the gate terminal of the first solid-state device based on the received current sense signal, so as to control switching thereof.

According to another aspect of the invention, a current sense transformer for sensing current in a power electronics circuit includes a primary PCB trace formed on a substrate of a PCB, the primary PCB trace connecting a pair of solid-state devices positioned on the PCB. The current sense transformer also includes a plurality of planar conductive traces formed within one or more layers of the substrate of the PCB, so as to be positioned below the primary PCB trace, and conductive pads formed on a surface of the substrate of the PCB at locations corresponding to opposing ends of each of the plurality of planar conductive traces to form pad mounted turns, the conductive pads providing electrical connections to the plurality of planar conductive traces. The current sense transformer further includes a plurality of conductive connectors coupled to the plurality of planar conductive traces to electrically and mechanically couple adjacent planar conductive traces together, the plurality of conductive connectors extending over the primary PCB trace, and wherein the primary PCB trace forms a primary side of the current sense transformer and the plurality of planar conductive traces, conductive pads, and plurality of conductive connectors form a secondary side of the current sense transformer.

According to yet another aspect of the invention, a method for performing current sensing and transistor timing control is provided in a power conversion circuit that includes a first solid-state switching device and one of a second solid-state switching device and a diode. The method includes measuring, via a current sense transformer, a current flowing on a primary conductive trace of the power conversion circuit that connects the first solid-state switching device and the one of the second solid-state switching device and the diode. The method also includes providing a current sense signal indicative of the current on the primary conductive trace to a controller and modulating, via the controller, a gate voltage to a gate terminal of the first solid-state switching device based on the received current sense signal, so as to control switching thereof.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 2:
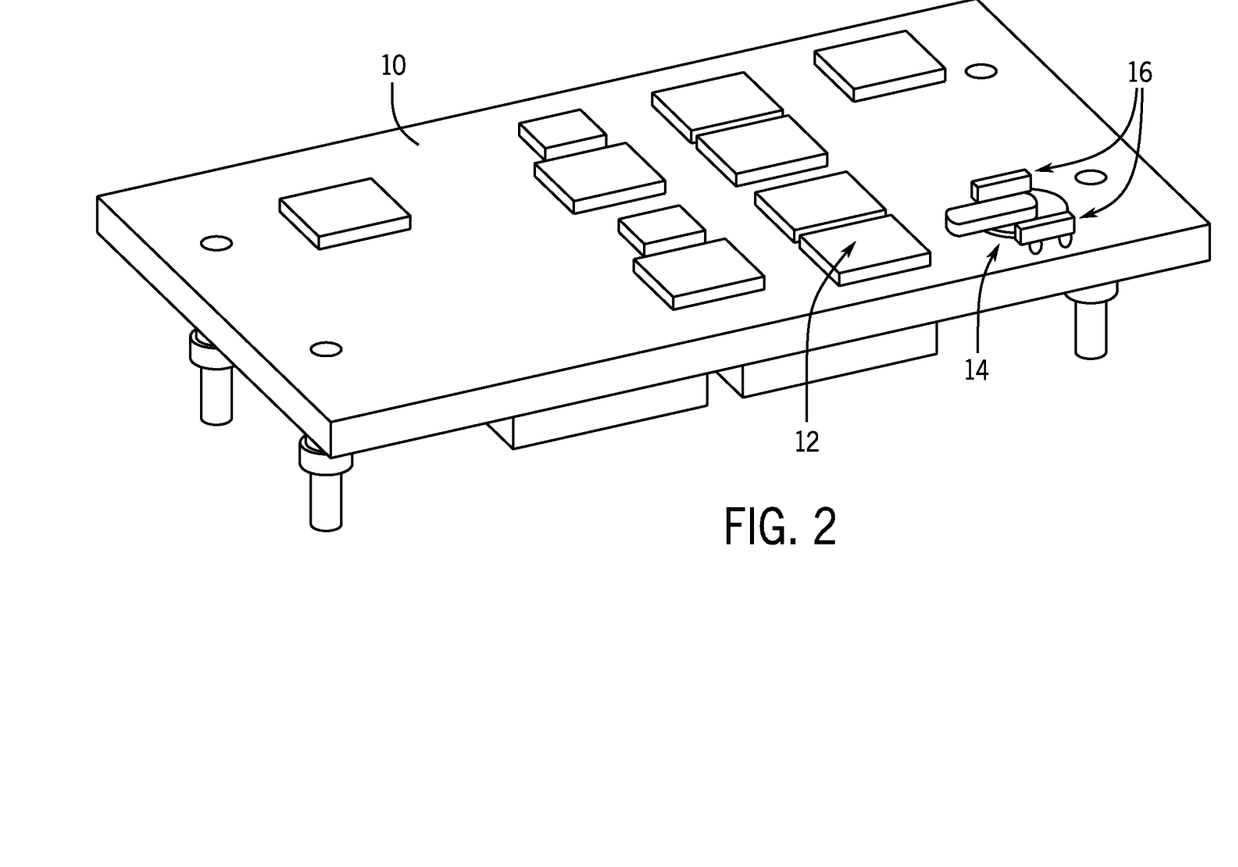
FIG. 2 a perspective and transparent view of a printed circuit board implementation of a power electronics circuit including a current sense transformer, according to an embodiment of the invention.

Referring to FIG. 2, a printed circuit board (PCB) 10 is illustrated that implements an electronic subsystem, such as a switching power supply or circuit including a power converter or other power electronics circuit, according to embodiments of the invention. In this example, PCB 10 includes various packaged and discrete electronic components 12, including power magnetic, switching devices, control circuitry, and the like, along with the appropriate connectors (not shown) by way of which the subsystem interfaces with a rack or larger system. A current sense transformer 14 according to an embodiment is shown as implemented on the top surface of PCB 10. As will be described in further detail below, current transformer 14 is constructed according to the embodiments disclosed herein to provide a small footprint that minimizes impact on the circuit layout (i.e., on packaged solid-state switching components 16 on the PCB 10) and that minimizes impact on the circuit inductance.

Figure 3:
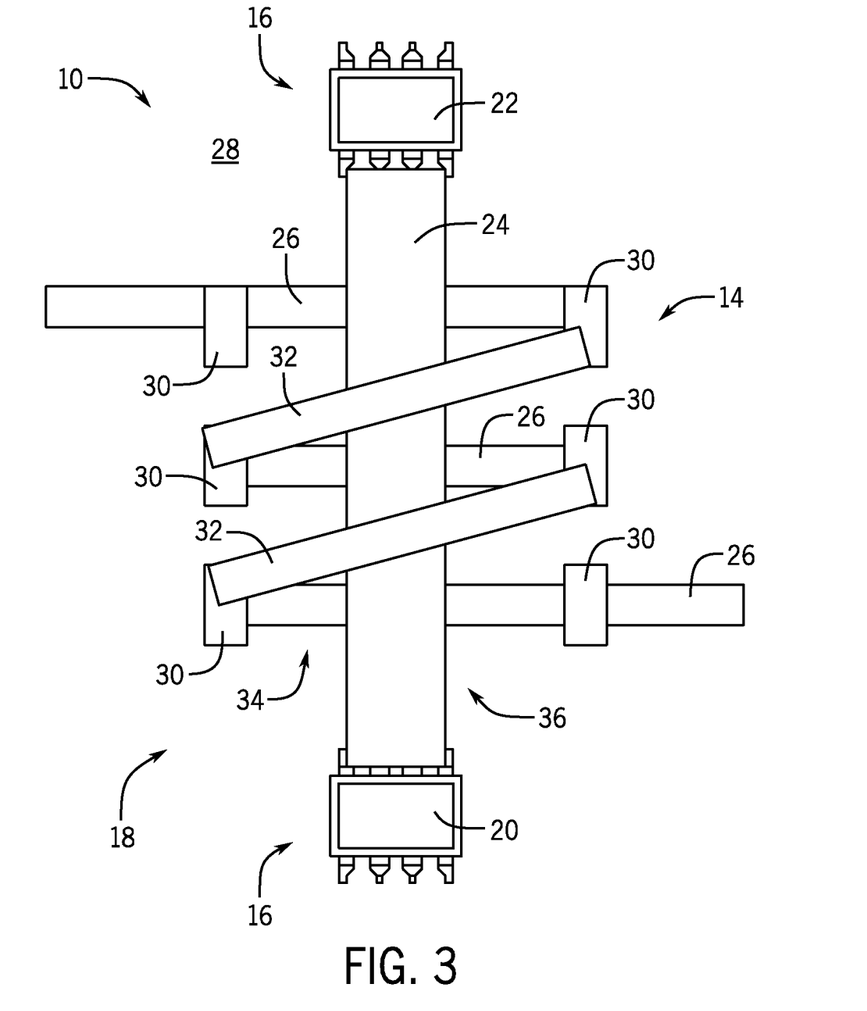
FIG. 3 is a detailed view of a current sense transformer according to an embodiment of the invention.

Referring now to FIG. 3, construction of a current sense transformer 14 and placement thereof relative to an arrangement of solid state devices 16 is illustrated in greater detail. While FIG. 3 illustrates placement of the current transformer 14 relative to a half-bridge circuit 18, it is recognized that an identical placement and construction of the current transformer 14 could also be implemented with a diode-solid state switch series connection. As shown in FIG. 3, a pair of metal oxide semiconductor field effect transistors (MOSFETs) 20, 22 are arranged to form half-bridge circuit 18 on PCB 10, with a thick copper primary trace 24 connecting the MOSFETs 20, 22 (i.e., the source of MOSFET 22 to the drain of MOSFET 20) and carrying current therebetween. While half-bridge circuit 18 is shown as including MOSFETs 20, 22, it is recognized that other power semiconductor devices may instead be utilized, including insulated gate bipolar transistors (IGBTs), bipolar junction transistors (BJTs), integrated gate-commutated thyristors (IGCTs), gate turn-off (GTO) thyristors, Silicon Controlled Rectifiers (SCRs), high electron mobility transistors (HEMT), or other devices or combinations of devices. Furthermore, it is recognized that MOSFETs 20, 22 (or other power semiconductor devices) of any number of suitable materials may be utilized, with exemplary materials including Silicon Carbide (SiC) and Gallium Nitride (GaN), but with Silicon (Si) and Gallium Arsenide (GaAs) being additional examples of suitable materials.

In constructing current transformer 14, one of the components of the transformer is realized by planar conductive traces 26 (e.g., copper traces) within PCB 10. In the example of FIG. 3, conductive traces 26 are planar in the sense that each trace 26 is individually realized in one or more separate layers of PCB 10. Each of traces 26 is brought to a surface 28 of PCB 10 via conductive pads 30 formed on each of opposing ends thereof—so as to form pad mounted turns. To electrically and mechanically couple adjacent conductive traces 26 together, a plurality of conductive connectors 32 are provided as additional components of transformer 14. In an exemplary embodiment, connectors 32 are in the form of conductive staples that are placed to connect adjacent conductive traces 26. It is recognized, however, that connectors 32 could have alternate constructions or alternate means by which they are fabricated. As one example, connectors 32 could alternatively be in the form of connective traces that are formed via a printing application (i.e., 3D printed trace and terminations to complete the circuit for current sensing). As another example, connectors 32 could alternatively be in the form of Litz wires that optimize the AC resistance of the circuit. As shown in FIG. 3, one end of a conductive connector 32 is connected to a pad 30 on first end of a conductive trace 26 and the opposite end of the conductive connector 32 is connected to a pad 30 on second end of an adjacent conductive trace 26, so as to couple the traces 26 together, with the conductive connector 32 being through-hole mounted or soldered onto pads 30 on either side of the primary trace 24. The conductive traces 26 and conductive connectors (e.g., staples, Litz wires, etc.) 32 collectively form a plurality of turns of a secondary winding/side 34 in current transformer 14—with the secondary winding/side 34 having a current therein that is proportional to a current flowing through a primary winding/side 36 thereof—i.e., primary trace 24. The current transformer 14 is therefore able to accurately sense current in half-bridge circuit 18 and output a current sense signal indicative of this current.

Beneficially, the construction of current transformer 14 allows for placement thereof at the indicated location between MOSFETs 20, 22 without impacting the circuit layout and/or the circuit inductance, such that the original signal on primary trace 24 of circuit 18 is not impeded or affected. The current transformer 14 is especially useful in power converters implementing wide band gap devices where the layout of solid-state devices is tight due to the need for fast switching.

Figure 4A:
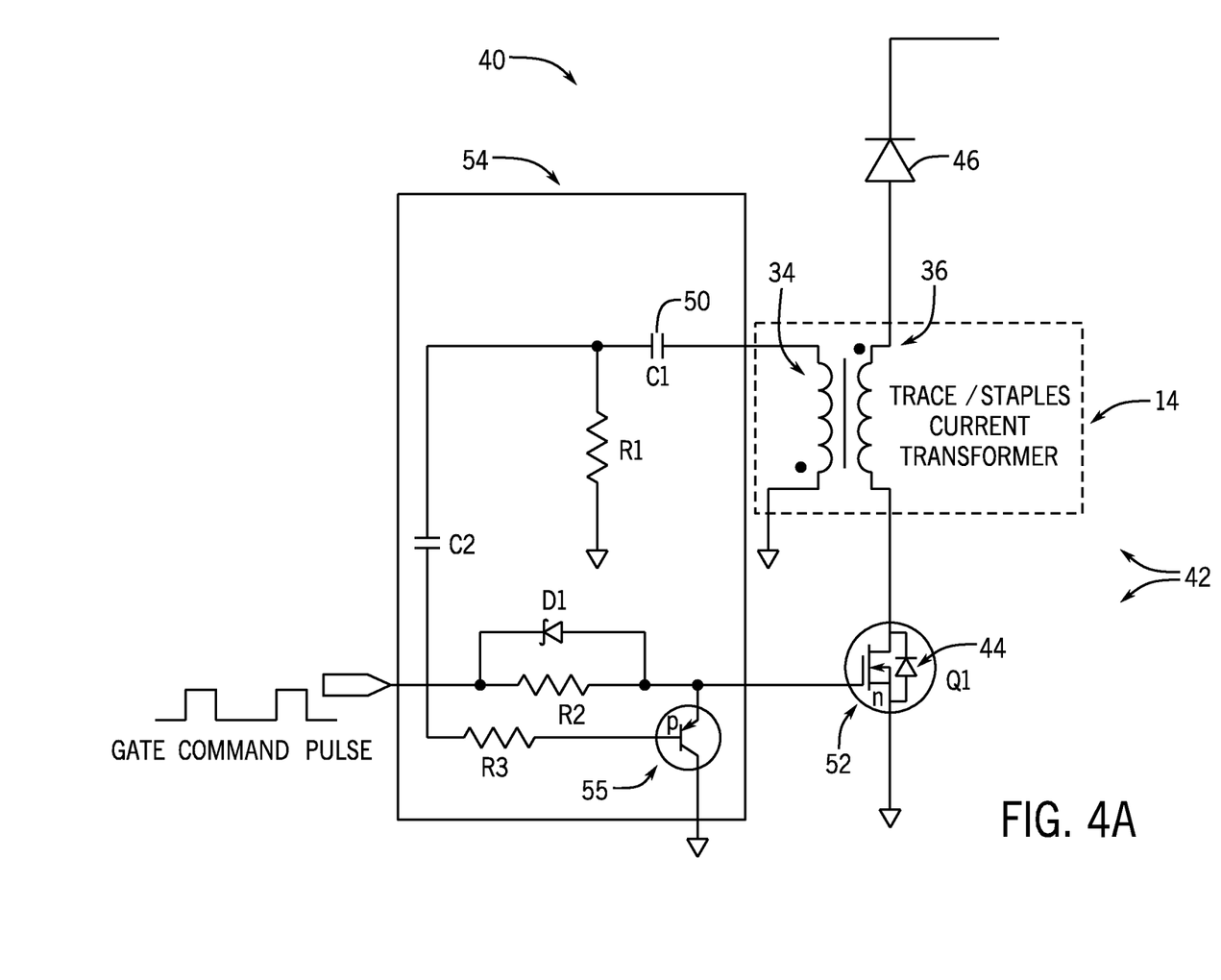
FIGS. 4A and 4B are schematic illustrations of power electronics circuits including the current sense transformer of FIG. 3, according to embodiments of the invention.
Figure 4B:
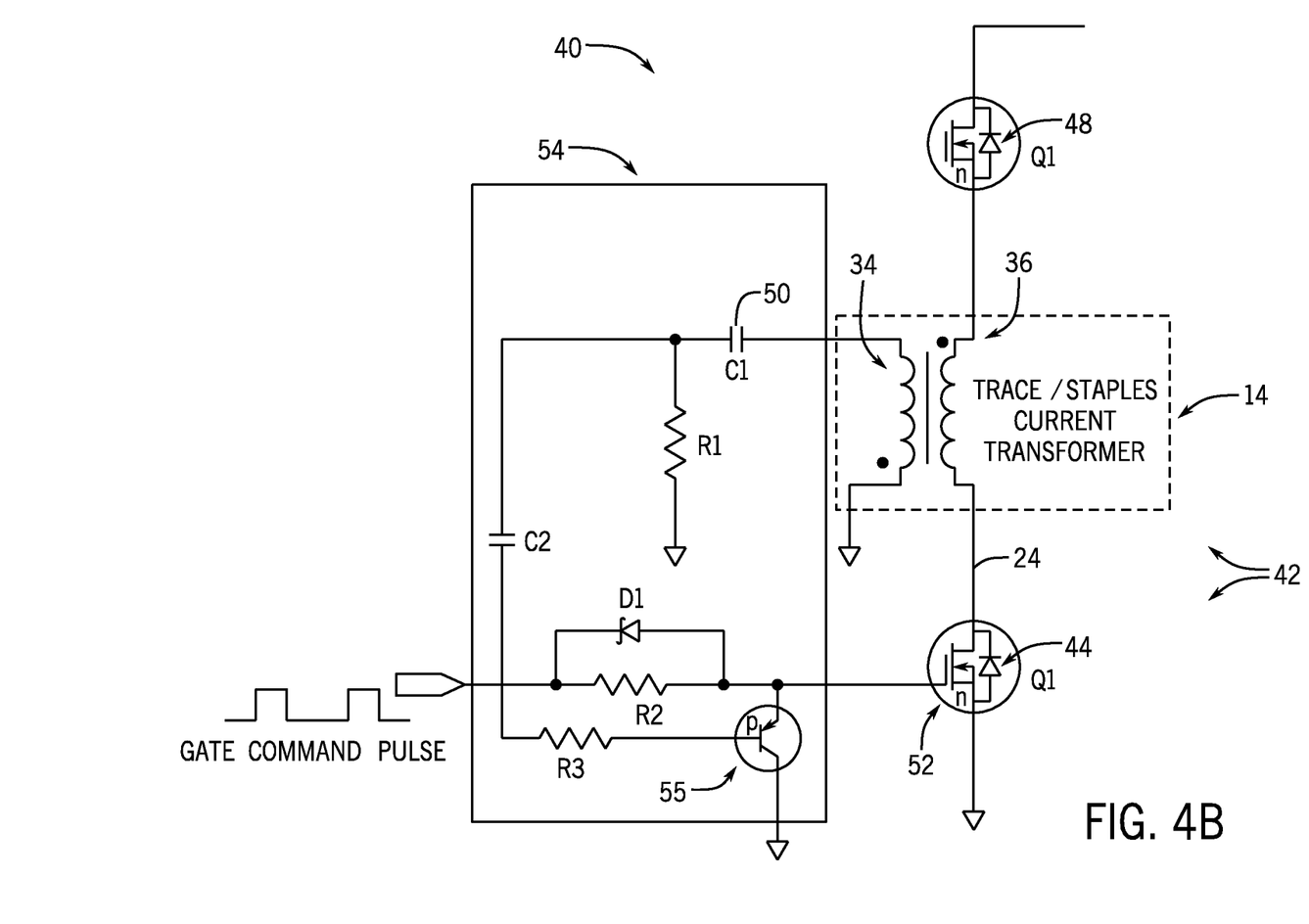

Referring now to FIGS. 4A and 4B, schematic circuit diagrams of power electronics circuits 40 that include a current transformer 14 as shown and described in FIG. 3 are illustrated, according to embodiments of the invention. In the power electronics circuit 40 illustrated in FIG. 4A, a diode-solid state switch series connection 42 is illustrated through which current is sensed via current transformer 14, with the diode-solid state switch series connection 42 including a MOSFET 44 and a diode 46, and with a capacitor and inductor (not shown) coupled in parallel with diode 46 to selectively store/discharge current during operation of the power electronics circuit 40. As previously indicated, it is recognized that other solid state devices/switching devices may be utilized in power electronics circuit 40, such as a half-bridge circuit comprising a pair of MOSFETS 44, 48 as illustrated in FIG. 4B, or other suitable switches (e.g., IGBTs, BJTs, SCRs, etc.) arranged in series. It is further recognized that, while power electronics circuit 40 is shown as including only a single phase leg and associated current transformer 14, embodiments of the invention encompass power electronics circuits comprising a three phase circuit, and that an associated current transformer 14 would be included on each phase leg in the three phase circuit.

In operation, it is recognized that, when MOSFET 44 is turned on, there is a stored charge in diode 46 that causes the diode 46 to behave as a short circuit. Alternatively, there may be a residual capacitance across the capacitor 48 that also is discharged when the MOSFET 44 is turned on. This current can cause loss in the switching devices as well as lead to EMI in the power electronics circuit 40. The current transformer 14 may operate to sense current through the power electronics circuit 40 in a quick fashion, so as to provide for dynamic modulation of the gate 52 of the MOSFET 44 and thereby minimize the shoot through currents and turn-on losses in the power electronics circuit 40, thereby also reducing ringing and EMI in the circuit, as set forth in greater detail below.

In operation, current transformer 14 outputs a current sense signal, $i_{sense}$, at its secondary 34 that is indicative of the current flowing through the thick copper primary trace 24 connecting the MOSFET 44 and diode 46. The current sense signal, $i_{sense}$, is provided to a controller 54 as an input thereto to provide operating data of the power electronics circuit 40 (i.e., of diode-solid state switch series connection 42), with the controller 54 being an analog circuit separate from a controller/electronics performing pulse width modulation (PWM) in the circuit 40, or alternatively being a high speed, digital controller that is part of the PWM controller/electronics. Controller 54 is programmed to receive the current sense signal and subsequently control operation/switching of MOSFET 44 based on the signal, utilizing a closed-loop control scheme for such operation/switching. Specifically, controller 54 analyzes the current sense signal received thereby in order to selectively generate a controlled voltage pulse signal (via capacitor 50 and transistor 55) that is provided to the gate 52 of the MOSFET 44 to modulate operation thereof. The pulse signal generated by controller 54 acts to control a shape of the gate waveform/turn-on signal as well as a timing thereof. The pulse signal may be applied for a short period, i.e., a "short pulse," to pull down or shape the gate voltage of MOSFET 44, so as to limit shoot-through current in the power electronics circuit 40 until the shoot-through current condition has been resolved.

With reference to the particular circuit 40 shown in FIGS. 4A and 4B, an implementation is shown where the gate of the MOSFET 44 in a half bridge is modulated to minimize shoot through current by sensing the current in primary trace 24 connecting MOSFET 44 and diode 46, although it is recognized that the top component can instead be MOSFET 48, as depicted in FIG. 4B. In the circuit 40 of FIG. 4B for example, when the gate 52 of the MOSFET 44 turns on, the gate of MOSFET 48 takes time to transition to a low state, and in this duration a shoot through current ensues. This shoot through current can cause excessive power dissipation in the MOSFETs 44, 48. Current transformer 14 thus acts to output a current sense signal, $i_{sense}$, to controller 54, which acts to generate a controlled voltage pulse signal, i.e., "shoot through current pulse"—which is communicated through a capacitor 50 in controller 54 to modulate a transistor 55 (e.g., PNP, MOSFET or similar device) for a short instant to reduce the gate drive voltage on MOSFET 44. This reduces the shoot through current and brings down the total power dissipated in the MOSFETs 44, 48, improving the overall performance of the circuit 40.

Figure 5A:
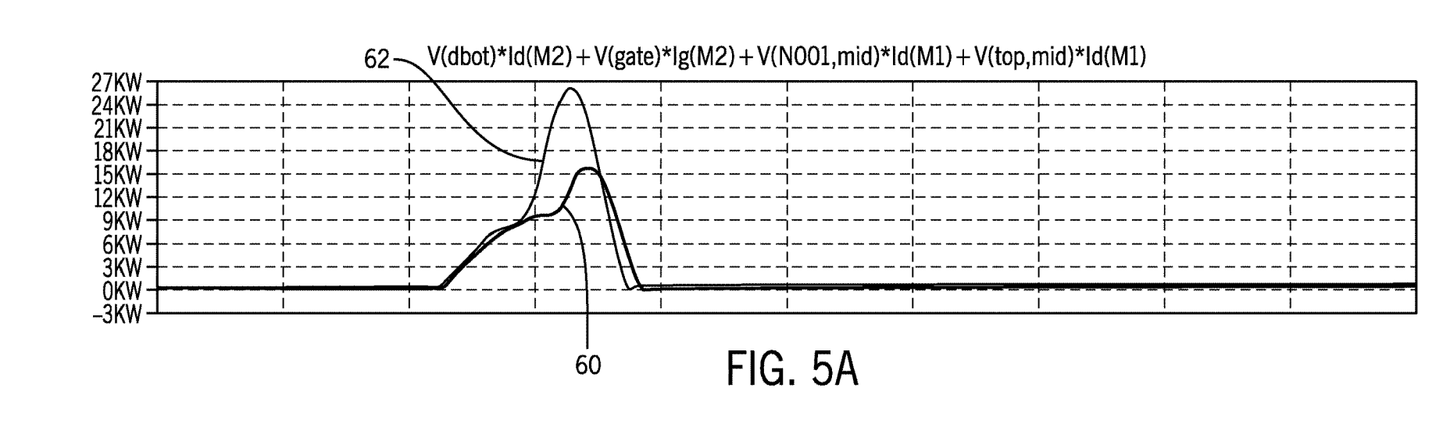
FIGS. 5A-5D are graphs illustrating various parameters measured during operation of the power electronics circuit of FIGS. 4A and 4B when implementing a switching control strategy utilizing measurements from the current transformer, as compared to such parameters when such a switching control strategy is not implemented.
Figure 5B:
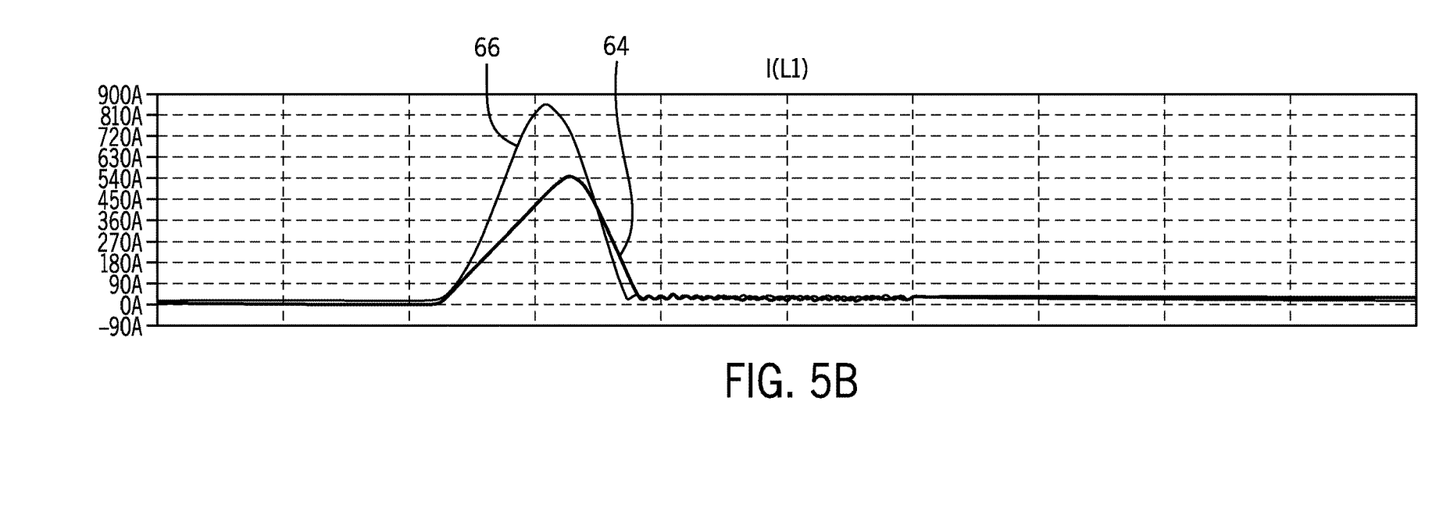
Figure 5C:
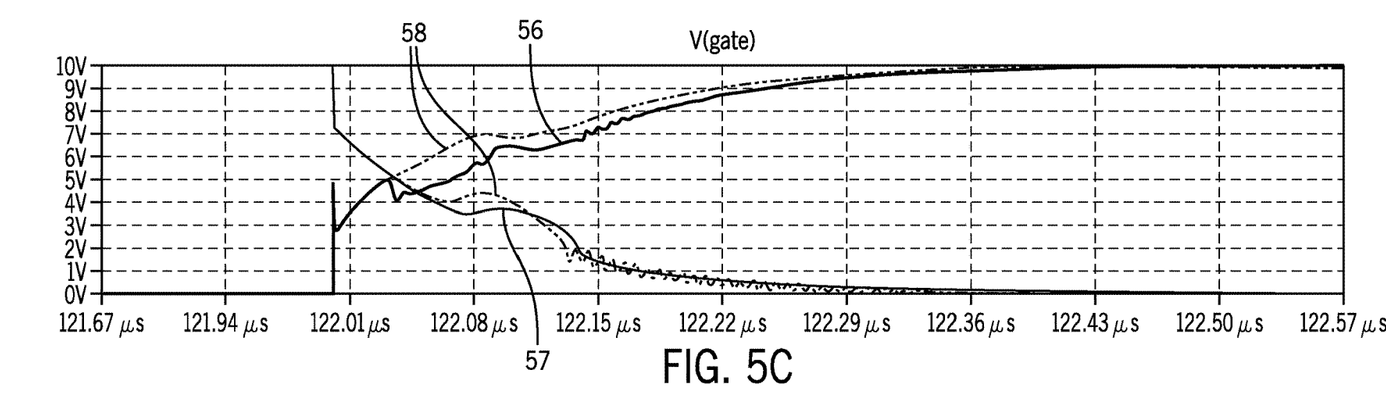
Figure 5D:
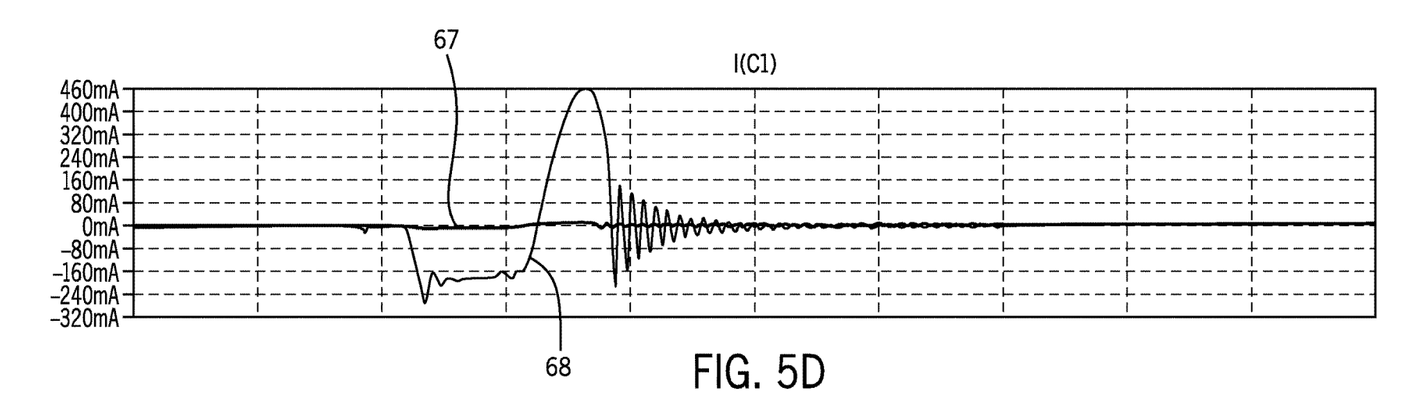

Referring to FIGS. 5A-5D, values of various operating parameters of the power electronics circuit 40 are illustrated, with values of these parameters being shown for a power electronics circuit 40 implementing the sensing of current via current transformer 14 (FIG. 3) and the use of the sensed current to modulate the turn-on gate voltage applied to MOSFET 44 and for a power electronics circuit 40 that does not include such a current transformer 14 and associated modulation scheme. As can be seen in FIG. 5A, the peak switching power/total power dissipation in switching connection 42 in the power electronics circuit 40 is reduced when controller 54 operates to generate a pulse signal that modulates the turn-on gate voltage of MOSFET 44 (i.e., pulls down the gate voltage in switches 44, 48, indicated at 56 as being pulled down in lower switch 44, at 57 as being pulled down in upper switch 48, and at 58 as not pulled down for upper and lower switches 44, 48, as shown in FIG. 5C), as indicated by peak switching power/total power dissipation 60, as compared to when such modulation is not performed, as indicated by peak switching power/total power dissipation 62. Similarly, as can be seen in FIG. 5B, the shoot through current in the power electronics circuit 40 is reduced/limited when controller 54 operates to generate a pulse signal that modulates the turn-on gate voltage of MOSFET 44 (i.e., pulls down the gate voltage in switches 44, 48, as shown in FIG. 5C), as indicated by shoot through current 64, as compared to when such modulation is not performed, as indicated by shoot through current 66. FIG. 5D illustrates a level of current in the current sense transformer 14 that is generated responsive to a sensed current through primary trace 24, with a current level indicated at 67 with no voltage pull down performed by the controller 54 (i.e., no a pulse signal generated that modulates the turn-on gate voltage of MOSFET), and with a current level indicated at 68 where a voltage pull down pulse signal is generated by the controller 54—with it being seen that a negative current is present in the current sense transformer 14 due to a shoot through current activating the voltage pull down controller 54.

According to embodiments of the invention, it is further recognized that the current measurements provided by current transformer 14 and the associated modulation of gate voltage/signals provided to MOSFET 44 performed by controller 54 may be further analyzed and utilized to provide protection to the power electronics circuit 40, as a diagnostic tool for the power electronics circuit 40, and as analytics for developing a long term control strategy for power electronics circuit 40.

As a first example, the controller 54 could be further programmed to track the voltage pulse signals generated thereby and provided to the gate 52 of the MOSFET 44 such that, if a number of the pulse signals exceeds a pre-determined threshold number, the controller 54 declares a fault condition in the power electronics circuit 40—as the exceeding of the threshold would indicate that a condition/fault exists in the power electronics circuit 40 causing the need for such pulse signals to be repeatedly generated by the controller 54. The declaring of a fault by the controller 54 may therefore serve as a protective feature in the power electronics circuit 40 that can serve as a short circuit protection.

As a second example, the controller 54 could be further programmed to track the voltage pulse signals generated thereby and provided to the gate 52 of the MOSFET 44 as a health monitoring and useful life analysis feature in the power electronics circuit 40. The number and frequency of the voltage pulse signals may be analyzed to determine trends in the generation of such pulses to see, for example, if the number/frequency of pulses generated in a given measured time period has increased as compared to a previously measured time period. An identified trend of pulses generated by the controller 54 over multiple measured time periods may be used to determine that the health of a particular component in the power electronics circuit 40 has deteriorated and/or may be used to estimate a remaining useful life of a particular component in the power electronics circuit 40.

As a third example, the controller 54 could be further programmed to track the voltage pulse signals generated thereby and provided to the gate 52 of the MOSFET 44 for purposes of implementing a switching control strategy for MOSFET 44 (and/or other solid state switches in the power electronics circuit 40). That is, controller 54 could be programmed to perform an analytics analysis on the gate voltage pulse signals previously provided to MOSFET 44 to determine a desirable long-term modulation scheme for MOSFET gating signals.

Figure 6:
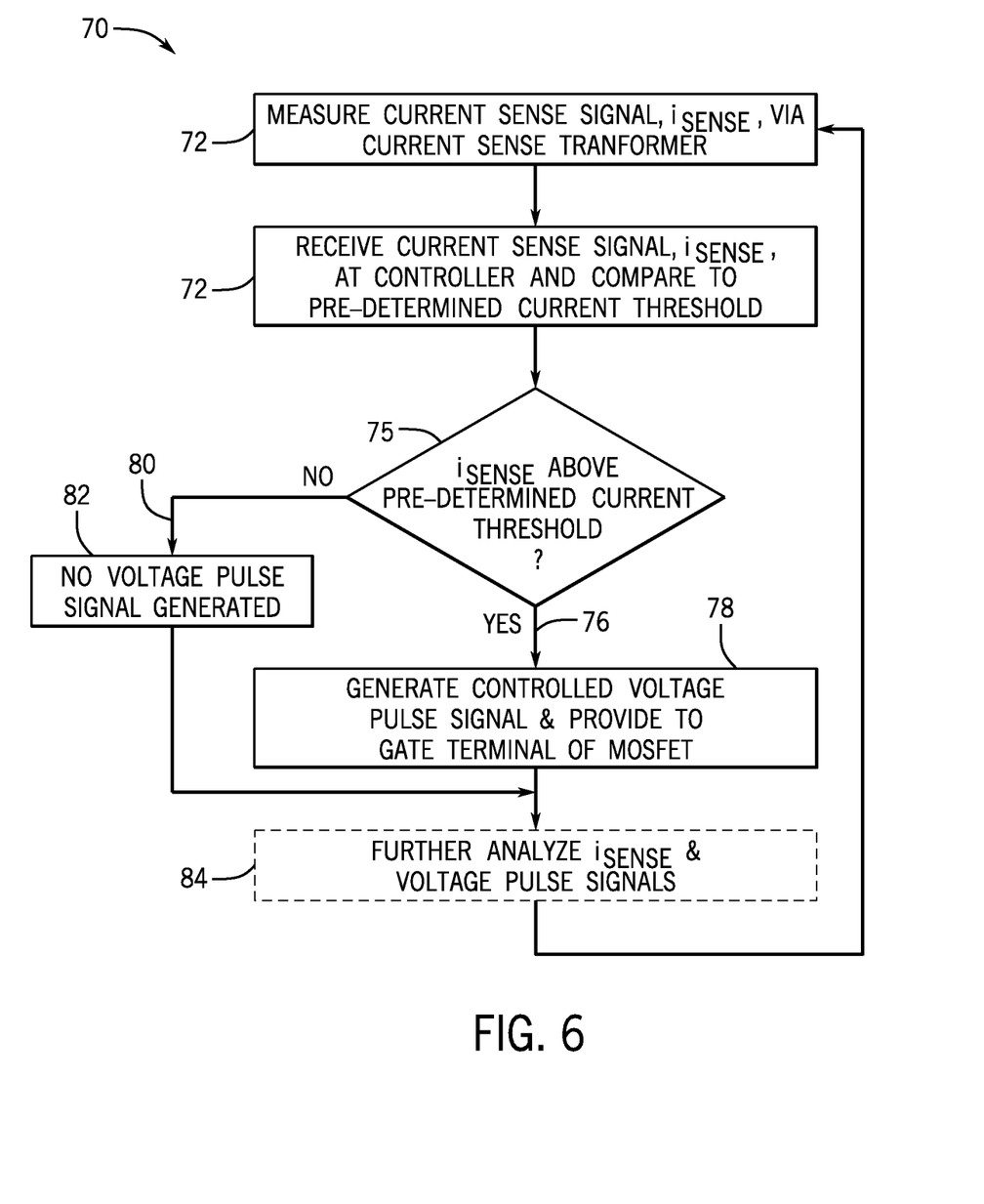
FIG. 6 is a flowchart illustrating a technique for rapid current sensing and switching control in a power electronics circuit according to an embodiment of the invention.

Referring now to FIG. 6, and with reference back to FIG. 4, a technique 70 for rapid current sensing and switching control in a power electronics circuit 40 is illustrated according to an embodiment of the invention. In a first step of technique 70, a current sense signal, $i_{sense}$, is measured by a current transformer 14 that is indicative of a current on a thick copper primary trace 24 connecting solid state devices—such as the MOSFET 44 and diode 46 in the diode-solid state switch series connection 42 of FIG. 4 (or alternatively the pair of MOSFETs 20, 22 of the half-bridge circuit 18 of FIG. 3)—with the current being measured upon the switching on of MOSFET 44, as indicated at STEP 72. At STEP 74, the current sense signal, $i_{sense}$, is then received by a controller 54 of power electronics circuit 40 and the controller 54 analyzes the received current sense signal and, in an exemplary embodiment, compares the current sense signal to a pre-determined current threshold value. As an example, the pre-determined current threshold value may be a current value above which it is determined that undesirably large current spikes, EMI, and dissipation and switching loss may be present. It is then determined at STEP 75 whether the current sense signal is above or below the pre-determined current threshold value.

If it is determined that the current sense signal is above the pre-determined current threshold value, as indicated at 76, then technique 70 continues at STEP 78 with the controller 54 generating a controlled voltage pulse signal that is provided to the gate 52 of MOSFET 44 to modulate operation thereof. The pulse signal generated by controller 54 acts to control a shape of the gate waveform/turn-on signal as well as a timing thereof, and may be applied for a short period to pull down or shape the gate voltage of MOSFET 44 and thereby limit shoot-through current in the power electronics circuit 40 until the shoot-through current condition has been resolved.

If it is determined at STEP 75 that the current sense signal is below the pre-determined current threshold value, as indicated at 80, then technique 70 continues at STEP 82 with the controller 54 not applying a voltage modulating pulse to the gate 52 of MOSFET 44—i.e., applying a gating voltage to the gate 52 of MOSFET 44 that is not pulled down based on the current sense signal. The technique 70 thus bypasses STEP 78, as it is determined that no pull down or shaping of the gate voltage of MOSFET 44 is required.

According to one embodiment, and as shown in phantom at STEP 84, the technique 70 may continue by performing a further analysis of the current measurements provided by current transformer 14 and the associated modulation of gate voltage/signals provided to MOSFET 44. The analysis of the current measurements and gate voltage modulation may be performed to provide protection to the power electronics circuit 40, as a diagnostic tool for the power electronics circuit 40, and as analytics for developing a long term control strategy for power electronics circuit 40. As one example, if a number of the voltage pulse signals exceeds a pre-determined threshold number, the controller 54 may declare a fault condition in the power electronics circuit 40 and implement a circuit protection feature to prevent a short circuit in the power electronics circuit 40. As another example, the voltage pulse signals could be analyzed as part of a health monitoring and useful life analysis feature—with trends in the generation of such pulses being identified to determine that the health of a particular component in the power electronics circuit 40 has deteriorated and/or to estimate a remaining useful life of a particular component in the power electronics circuit 40. As yet another example, the voltage pulse signals could be tracked for purposes of implementing a long-term switching control strategy for MOSFET 44.

As shown in FIG. 6, the technique 70 may then continue by looping back to STEP 72, with a next current sense signal, $i_{sense}$, being measured (and subsequently provided to controller 54) to repeat the technique for rapid current sensing and switching control in the power electronics circuit 40.

Beneficially, embodiments of the invention are thus directed to a system and method for rapid and low loss sensing of phenomena in power electronics circuits, such as shoot through currents. The system and associated method provide for accurate control and switching in power electronics circuits to minimize shoot through currents, turn-on losses, and EMI. A current transformer is constructed so as to have minimal impact on circuit inductance and circuit layout, as might be especially useful in/with electric vehicles that implement power electronics converters such as on-board chargers, traction inverters (and on board distribution at 48V) having wide band gap devices such as SiC and GaN switches and/or other power electronics circuits having tight layouts. The current transformer provides a means for quick current sensing that can be used in conjunction with a controller to dynamically control and modulate gate signals to control switching of solid state devices and thereby enable the minimizing of shoot through currents, turn-on losses, and EMI. The current transformer and associated controller are provided as an inexpensive and scalable circuit that can be implemented at the chip level and/or at a module level, to provide flexibility in device and circuit design while providing quick and accurate current sensing and switching control in each embodiment. The current monitoring can be tracked over time to enable health and welfare monitoring of the circuit for improving long term reliability.

Therefore, according to one embodiment of the invention, a power electronics circuit includes a switching circuit comprising a first solid-state device coupled in series with a second solid-state device, with at least the first solid-state device comprising a solid-state switch having a gate terminal. The power electronics circuit also includes a current sense transformer positioned between the first and second solid-state devices and configured to sense a current flowing on a conductive trace connecting the first and second solid-state devices, and a controller coupled to the switching circuit and the current sense transformer so as to be in operable communication therewith. The controller is programmed to receive a current sense signal from the current sense transformer indicative of the current flowing on the conductive trace and modulate a gate voltage to the gate terminal of the first solid-state device based on the received current sense signal, so as to control switching thereof.

According to another embodiment of the invention, a current sense transformer for sensing current in a power electronics circuit includes a primary PCB trace formed on a substrate of a PCB, the primary PCB trace connecting a pair of solid-state devices positioned on the PCB. The current sense transformer also includes a plurality of planar conductive traces formed within one or more layers of the substrate of the PCB, so as to be positioned below the primary PCB trace, and conductive pads formed on a surface of the substrate of the PCB at locations corresponding to opposing ends of each of the plurality of planar conductive traces to form pad mounted turns, the conductive pads providing electrical connections to the plurality of planar conductive traces. The current sense transformer further includes a plurality of conductive connectors coupled to the plurality of planar conductive traces to electrically and mechanically couple adjacent planar conductive traces together, the plurality of conductive connectors extending over the primary PCB trace, and wherein the primary PCB trace forms a primary side of the current sense transformer and the plurality of planar conductive traces, conductive pads, and plurality of conductive connectors form a secondary side of the current sense transformer.

According to yet another embodiment of the invention, a method for performing current sensing and transistor timing control is provided in a power conversion circuit that includes a first solid-state switching device and one of a second solid-state switching device and a diode. The method includes measuring, via a current sense transformer, a current flowing on a primary conductive trace of the power conversion circuit that connects the first solid-state switching device and the one of the second solid-state switching device and the diode. The method also includes providing a current sense signal indicative of the current on the primary conductive trace to a controller and modulating, via the controller, a gate voltage to a gate terminal of the first solid-state switching device based on the received current sense signal, so as to control switching thereof.

Embodiments of the present invention have been described in terms of the preferred embodiment, and it is recognized that equivalents, alternatives, and modifications, aside from those expressly stated, are possible and within the scope of the appending claims.

What is claimed is:

1. A power electronics circuit comprising:
   a switching circuit comprising a first solid-state device coupled in series with a second solid-state device, with at least the first solid-state device comprising a first solid-state switch having a gate terminal;
   a current sense transformer positioned between the first and second solid-state devices and configured to sense a current flowing on a conductive trace connecting the first and second solid-state devices;
   a printed circuit board (PCB) having mounted thereon the switching circuit and the current sense transformer, and wherein the current sense transformer comprises:
      a plurality of planar conductive traces formed within the PCB;
      conductive pads formed on the surface of the PCB at locations corresponding to opposing ends of each of the plurality of planar conductive traces, so as to provide electrical connections to the plurality of planar conductive traces; and
      a plurality of conductive connectors coupled to the plurality of planar conductive traces to electrically and mechanically couple adjacent planar conductive traces together; and
   a controller coupled to the switching circuit and the current sense transformer so as to be in operable communication therewith, the controller programmed to:
      receive a current sense signal from the current sense transformer indicative of the current flowing on the conductive trace; and
      modulate a gate voltage to the gate terminal of the first solid-state device based on the received current sense signal, so as to control switching thereof.

2. The power electronics circuit of claim 1 wherein the plurality of conductive connectors comprise one of:
   pre-formed conductive staples coupled to the conductive pads on the surface of the PCB to connect the adjacent planar conductive traces; or
   Litz wires coupled to the conductive pads on the surface of the PCB to connect the adjacent planar conductive traces;
   with the conductive staples or Litz wires being through-hole mounted, soldered, or printed onto the conductive pads on the surface of the PCB.

3. The power electronics circuit of claim 1 wherein the switching circuit comprises a half-bridge circuit comprising the first solid-state switch and a second solid-state switch.

4. The power electronics circuit of claim 1 wherein the switching circuit comprises a diode-solid state switch series connection comprising the first solid-state switch and a diode.

5. The power electronics circuit of claim 1 wherein the first solid-state switch comprises one of a metal oxide semiconductor field effect transistor (MOSFET), a high electron mobility transistor (HEMT), an insulated gate bipolar transistor (IGBT), a bipolar junction transistor (BJT), an integrated gate-commutated thyristor (IGCT), a gate turn-off (GTO) thyristor, or a silicon controlled rectifier (SCR).

6. The power electronics circuit of claim 1 wherein the first solid-state switch is formed of silicon carbide (SiC) or gallium nitride (GaN).

7. The power electronics circuit of claim 2 wherein the plurality of planar conductive traces and the plurality of conductive connectors collectively form a secondary transformer side in the current sense transformer, with the conductive trace connecting the first and second solid-state devices forming a primary transformer side.

8. A current sense transformer for sensing current in a power electronics circuit:
   a primary printed circuit board (PCB) trace formed on a substrate of a PCB, the primary PCB trace connecting a pair of solid-state devices positioned on the PCB;
   a plurality of planar conductive traces formed within one or more layers of the substrate of the PCB, so as to be positioned below the primary PCB trace;
   conductive pads formed on a surface of the substrate of the PCB at locations corresponding to opposing ends of each of the plurality of planar conductive traces to form pad mounted turns, the conductive pads providing electrical connections to the plurality of planar conductive traces; and
   a plurality of conductive connectors coupled to the plurality of planar conductive traces to electrically and mechanically couple adjacent planar conductive traces together, the plurality of conductive connectors extending over the primary PCB trace;
   wherein the primary PCB trace forms a primary side of the current sense transformer and the plurality of planar conductive traces, conductive pads, and plurality of conductive connectors form a secondary side of the current sense transformer.

9. The current sense transformer of claim 8 wherein the plurality of conductive connectors comprise pre-formed conductive staples or Litz wires coupled to the conductive pads on the surface of the PCB to connect the adjacent planar conductive traces.

10. The current sense transformer of claim 8 wherein the plurality of planar conductive traces and plurality of conductive connectors add minimal inductance to the power electronics circuit.

11. A method for performing current sensing and transistor timing control in a power conversion circuit that includes a first solid-state switching device and one of a second solid-state switching device and a diode, the method comprising:
   measuring, via a current sense transformer, a current flowing on a primary conductive trace of the power conversion circuit that connects the first solid-state switching device and the one of the second solid-state switching device and the diode;
   providing a current sense signal indicative of the current on the primary conductive trace to a controller; and
   modulating, via the controller, a gate voltage to a gate terminal of at least one of the first and second solid-state switching devices based on the received current sense signal, so as to control switching thereof;
   wherein modulating the gate voltage to the gate terminal of at least one of the first and second solid-state switching devices comprises:
      comparing the current sense signal to a pre-determined current threshold value;
      generating and applying a controlled voltage pulse signal to the gate terminal of the first solid-state switching device when the current sense signal exceeds the pre-determined current threshold value, so as to pull down and/or shape the gate voltage to the gate terminal; and
      modulating the gate voltage to the gate terminal of the first solid-state switching device without generating and applying a controlled voltage pulse signal when the current sense signal is below the pre-determined current threshold value.

12. The method of claim 11 further comprising:
   comparing a number of generated voltage pulse signals to a pre-determined threshold pulse count;
   declaring a fault condition in the power conversion circuit when the number of generated voltage pulse signals exceeds the pre-determined threshold pulse count; and
   implementing a circuit protection scheme upon declaration of the fault condition, so as to prevent a short circuit in the power conversion circuit.

13. The method of claim 11 further comprising:
   identifying a trend across a number of generated voltage pulse signals; and
   determining the health and/or estimating a remaining useful life of one or more components in the power conversion circuit based on the identified trend.

14. The method of claim 11 further comprising:
   tracking the number of generated controlled voltage pulse signals; and
   performing an analytics analysis of the tracked generated voltage pulse signals to determine a long-term switching control strategy for the first solid-state switching device.

15. A power electronics circuit comprising:
   a switching circuit comprising a first solid-state device coupled in series with a second solid-state device, with at least the first solid-state device comprising a first solid-state switch having a gate terminal;
   a current sense transformer positioned between the first and second solid-state devices and configured to sense a current flowing on a conductive trace connecting the first and second solid-state devices; and
   a controller coupled to the switching circuit and the current sense transformer so as to be in operable communication therewith, the controller programmed to:
      receive a current sense signal from the current sense transformer indicative of the current flowing on the conductive trace; and
      modulate a gate voltage to the gate terminal of the first solid-state device based on the received current sense signal, so as to control switching thereof;
   wherein, in modulating the gate voltage to the gate terminal, the controller is programmed to:
      compare the current sense signal to a pre-determined current threshold value;
      generate and apply a voltage pulse signal to the gate terminal of the first solid-state device when the current sense signal exceeds the pre-determined current threshold value, so as to pull down and/or shape the gate voltage to the gate terminal; and
      modulate the gate voltage to the gate terminal of the first solid-state device without generating and applying a voltage pulse signal when the current sense signal is below the pre-determined current threshold value.

16. The power electronics circuit of claim 15 wherein the controller is further programmed to:
   compare a number of generated voltage pulse signals to a pre-determined threshold pulse count;
   declare a fault condition in the power electronics circuit when the number of generated voltage pulse signals exceeds the pre-determined threshold pulse count; and implement a circuit protection scheme upon declaration of the fault condition, so as to prevent a short circuit in the power electronics circuit.

17. The power electronics circuit of claim 15 wherein the controller is further programmed to:
identify a trend across a number of generated voltage pulse signals;
determine the health and/or to estimate a remaining useful life of one or more components in the power electronics circuit based on the identified trend.

18. The power electronics circuit of claim 15 wherein the controller is further programmed to:
track the number of generated controlled voltage pulse signals; and
perform an analytics analysis of the tracked generated voltage pulse signals to determine a long-term switching control strategy for the first solid-state device.

* * * * *